US010008452B2

(12) United States Patent
Ma et al.

(10) Patent No.: US 10,008,452 B2
(45) Date of Patent: Jun. 26, 2018

(54) MICROELECTRONIC STRUCTURES HAVING LAMINATED OR EMBEDDED GLASS ROUTING STRUCTURES FOR HIGH DENSITY PACKAGING

(71) Applicant: INTEL CORPORATION, Santa Clara, CA (US)

(72) Inventors: Qing Ma, Saratoga, CA (US); Johanna M. Swan, Scottsdale, AZ (US); Robert Starkston, Phoenix, AZ (US); John S. Guzek, Chandler, AZ (US); Robert L. Sankman, Phoenix, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/469,964

(22) Filed: Mar. 27, 2017

(65) Prior Publication Data

US 2017/0200677 A1 Jul. 13, 2017

Related U.S. Application Data

(62) Division of application No. 14/618,235, filed on Feb. 10, 2015, now Pat. No. 9,642,248, which is a division
(Continued)

(51) Int. Cl.
*H01L 29/40* (2006.01)
*H01L 23/538* (2006.01)
(Continued)

(52) U.S. Cl.
CPC ........ *H01L 23/5386* (2013.01); *H01L 21/486* (2013.01); *H01L 21/4857* (2013.01);
(Continued)

(58) Field of Classification Search
CPC ............. H01L 23/5386; H01L 21/4857; H01L 21/486; H01L 21/6835; H01L 23/15
(Continued)

(56) References Cited

U.S. PATENT DOCUMENTS

| 3,958,317 A | 5/1976 | Peart et al. |
| 4,221,047 A | 9/1980 | Narken et al. |

(Continued)

FOREIGN PATENT DOCUMENTS

| CN | 101542719 | 9/2009 |
| EP | 1 164 823 | 9/2003 |

(Continued)

OTHER PUBLICATIONS

Decision of Refusal for Japanese Patent Application No. 2012-542016, dated May 20, 2014.
(Continued)

*Primary Examiner* — Tremesha S Willis
(74) *Attorney, Agent, or Firm* — Green, Howard & Mughal LLP.

(57) ABSTRACT

Embodiments of the present description relate to the field of fabricating microelectronic structures. The microelectronic structures may include a glass routing structure formed separately from a trace routing structure, wherein the glass routing structure is incorporated with the trace routing substrate, either in a laminated or embedded configuration. Also disclosed are embodiments of a microelectronic package including at least one microelectronic device disposed proximate to the glass routing structure of the microelectronic substrate and coupled with the microelectronic substrate by a plurality of interconnects. Further, disclosed are embodiments of a microelectronic structure including at least one microelectronic device embedded within a microelectronic encapsulant having a glass routing structure
(Continued)

attached to the microelectronic encapsulant and a trace routing structure formed on the glass routing structure.

20 Claims, 16 Drawing Sheets

Related U.S. Application Data of application No. 13/625,406, filed on Sep. 24, 2012, now Pat. No. 9,001,520.

(51) Int. Cl.
*H01L 23/15* (2006.01)
*H01L 25/065* (2006.01)
*H01L 23/00* (2006.01)
*H01L 21/48* (2006.01)
*H01L 23/498* (2006.01)
*H01L 21/683* (2006.01)

(52) U.S. Cl.
CPC .......... *H01L 21/6835* (2013.01); *H01L 23/15* (2013.01); *H01L 23/49816* (2013.01); *H01L 23/5383* (2013.01); *H01L 23/5384* (2013.01); *H01L 24/09* (2013.01); *H01L 24/81* (2013.01); *H01L 25/0655* (2013.01); *H01L 2221/68345* (2013.01); *H01L 2221/68359* (2013.01); *H01L 2224/08238* (2013.01); *H01L 2224/81192* (2013.01); *H01L 2924/15331* (2013.01); *H01L 2924/15724* (2013.01); *H01L 2924/15747* (2013.01)

(58) Field of Classification Search
USPC ......... 257/684–687, 698, 701; 174/250, 251, 174/255–262
See application file for complete search history.

(56) References Cited

U.S. PATENT DOCUMENTS

| | | |
|---|---|---|
| 4,327,143 A | 4/1982 | Alvino et al. |
| 4,379,553 A | 4/1983 | Kelly |
| 4,639,543 A | 1/1987 | Fang |
| 4,664,309 A | 5/1987 | Allen et al. |
| 4,828,597 A | 5/1989 | Glascock et al. |
| 4,975,103 A | 12/1990 | Ackermann et al. |
| 5,193,668 A | 3/1993 | Fukuchi et al. |
| 5,294,238 A | 3/1994 | Fukada et al. |
| 5,466,488 A | 11/1995 | Toyoda et al. |
| 5,585,675 A | 12/1996 | Knopt |
| 5,611,876 A | 3/1997 | Newton et al. |
| 5,612,171 A | 3/1997 | Bhagavatula |
| 5,668,405 A | 9/1997 | Yamashita |
| 5,705,855 A | 1/1998 | Carson et al. |
| 5,917,652 A | 6/1999 | Mathers et al. |
| 5,981,880 A | 11/1999 | Appelt et al. |
| 6,023,098 A | 2/2000 | Higashiguchi et al. |
| 6,037,656 A | 3/2000 | Sugahara |
| 6,156,413 A | 12/2000 | Tomari et al. |
| 6,177,707 B1 | 1/2001 | Dekker et al. |
| 6,194,762 B1 | 2/2001 | Yamazaki et al. |
| 6,309,901 B1 | 10/2001 | Tahon et al. |
| 6,320,547 B1 | 11/2001 | Fathy et al. |
| 6,329,610 B1 | 12/2001 | Takubo et al. |
| 6,339,197 B1 | 1/2002 | Fushie et al. |
| 6,534,723 B1 | 3/2003 | Asai et al. |
| 6,539,750 B1 | 4/2003 | Takagi et al. |
| 6,673,698 B1 | 1/2004 | Lin et al. |
| 6,691,409 B2 | 2/2004 | Suzuki et al. |
| 6,772,514 B2 | 8/2004 | Ogura et al. |
| 6,781,064 B1 | 8/2004 | Appelt et al. |
| 6,799,438 B2 | 10/2004 | Herzbach et al. |
| 6,839,946 B2 | 1/2005 | Ylilammi et al. |
| 6,894,358 B2 | 5/2005 | Leib et al. |
| 6,989,604 B1 | 1/2006 | Woo et al. |
| 7,038,309 B2 | 5/2006 | Hsu et al. |
| 7,071,521 B2 | 7/2006 | Leib et al. |
| 7,072,018 B2 | 7/2006 | Yamamura et al. |
| 7,091,589 B2 | 8/2006 | Mori et al. |
| 7,164,572 B1 | 1/2007 | Burdon et al. |
| 7,176,131 B2 | 2/2007 | Meyer-Berg et al. |
| 7,259,080 B2 | 8/2007 | Quenzer et al. |
| 7,279,771 B2 | 10/2007 | Sunohara et al. |
| 7,285,834 B2 | 10/2007 | Leib et al. |
| 7,307,852 B2 | 12/2007 | Inagaki et al. |
| 7,337,540 B2 | 3/2008 | Kurosawa |
| 7,362,403 B2 | 4/2008 | Uehara |
| 7,476,623 B2 | 1/2009 | Schreder et al. |
| 7,749,900 B2 | 7/2010 | Li et al. |
| 7,993,510 B2 | 8/2011 | En |
| 8,207,453 B2 | 6/2012 | Ma et al. |
| 2001/0042854 A1 | 11/2001 | Matsumoto |
| 2002/0038725 A1 | 4/2002 | Suzuki et al. |
| 2002/0046880 A1 | 4/2002 | Takubo et al. |
| 2002/0145197 A1 | 10/2002 | Ohta et al. |
| 2002/0159243 A1 | 10/2002 | Ogawa et al. |
| 2002/0180015 A1 | 12/2002 | Yamaguchi et al. |
| 2002/0182958 A1 | 12/2002 | Tani et al. |
| 2003/0063453 A1 | 4/2003 | Kusagaya et al. |
| 2003/0066683 A1 | 4/2003 | Suzuki et al. |
| 2004/0071960 A1 | 4/2004 | Weber et al. |
| 2004/0137701 A1 | 7/2004 | Takao |
| 2004/0151882 A1 | 8/2004 | Tani et al. |
| 2004/0168825 A1 | 9/2004 | Sakamoto et al. |
| 2004/0178492 A1 | 9/2004 | Tsukamoto et al. |
| 2004/0217455 A1 | 11/2004 | Shiono et al. |
| 2004/0239349 A1 | 12/2004 | Yamagishi et al. |
| 2005/0012217 A1 | 1/2005 | Mori et al. |
| 2005/0016764 A1 | 1/2005 | Echigo et al. |
| 2005/0098882 A1 | 5/2005 | Kusagaya et al. |
| 2005/0189136 A1 | 9/2005 | Kawasaki et al. |
| 2005/0218503 A1 | 10/2005 | Abe et al. |
| 2006/0005382 A1 | 1/2006 | Hsien |
| 2006/0043572 A1 | 3/2006 | Sugimoto et al. |
| 2006/0191708 A1 | 8/2006 | Kawasaki et al. |
| 2006/0191710 A1 | 8/2006 | Fushie et al. |
| 2006/0201201 A1 | 9/2006 | Fushie et al. |
| 2006/0201818 A1 | 9/2006 | Fushie et al. |
| 2006/0216897 A1 | 9/2006 | Lee et al. |
| 2006/0244128 A1 | 11/2006 | Hayashi et al. |
| 2006/0255816 A1 | 11/2006 | Shioga et al. |
| 2006/0255817 A1 | 11/2006 | Yamagishi et al. |
| 2006/0261364 A1 | 11/2006 | Suehiro et al. |
| 2006/0289968 A1 | 12/2006 | Sulfridge |
| 2007/0060970 A1 | 3/2007 | Burdon et al. |
| 2007/0090416 A1 | 4/2007 | Doyle et al. |
| 2007/0096328 A1 | 5/2007 | Takahashi et al. |
| 2007/0119619 A1 | 5/2007 | Nakamura et al. |
| 2007/0154741 A1 | 7/2007 | Takahashi et al. |
| 2007/0175025 A1 | 8/2007 | Tsukamoto et al. |
| 2007/0186414 A1 | 8/2007 | Abe et al. |
| 2007/0227765 A1 | 10/2007 | Sakamoto et al. |
| 2007/0230151 A1 | 10/2007 | Hayashi et al. |
| 2007/0257356 A1 | 11/2007 | Abe et al. |
| 2007/0267138 A1 | 11/2007 | White et al. |
| 2008/0073110 A1 | 3/2008 | Shioga et al. |
| 2008/0107863 A1 | 5/2008 | Ikeda et al. |
| 2008/0149384 A1 | 6/2008 | Kawabe |
| 2008/0152928 A1 | 6/2008 | Miyauchi et al. |
| 2008/0164057 A1 | 7/2008 | Mori et al. |
| 2008/0217748 A1 | 9/2008 | Knickerbocker |
| 2008/0261005 A1 | 10/2008 | Nomiya et al. |
| 2008/0277148 A1 | 11/2008 | Asai et al. |
| 2008/0283277 A1 | 11/2008 | Muramatsu et al. |
| 2008/0283282 A1 | 11/2008 | Kawasaki et al. |
| 2009/0001550 A1 | 1/2009 | Li et al. |
| 2009/0159316 A1 | 6/2009 | Kuramochi et al. |
| 2009/0174065 A1 | 7/2009 | Hayashi et al. |
| 2009/0183910 A1 | 7/2009 | Sunohara |
| 2009/0243065 A1 | 10/2009 | Sugino et al. |
| 2009/0273073 A1 | 11/2009 | Tachibana et al. |
| 2009/0293271 A1 | 12/2009 | Tanaka |

(56) References Cited

U.S. PATENT DOCUMENTS

| | | | |
|---|---|---|---|
| 2009/0294161 A1 | 12/2009 | Yoshimura et al. |
| 2010/0006328 A1 | 1/2010 | Kawasaki et al. |
| 2010/0019382 A1 | 1/2010 | Miwa et al. |
| 2010/0032826 A1 | 2/2010 | Tachibana et al. |
| 2010/0164030 A1 | 7/2010 | Oggioni et al. |
| 2011/0101399 A1 | 5/2011 | Suehiro et al. |
| 2011/0147055 A1 | 6/2011 | Ma et al. |
| 2011/0147059 A1 | 6/2011 | Ma et al. |
| 2011/0233786 A1 | 9/2011 | Homma et al. |
| 2012/0106117 A1 | 5/2012 | Sundaram et al. |
| 2012/0192413 A1 | 8/2012 | Ma et al. |
| 2014/0003009 A1 | 1/2014 | Ma et al. |

FOREIGN PATENT DOCUMENTS

| | | |
|---|---|---|
| EP | 1 298 972 | 8/2005 |
| JP | 61-116881 | 6/1986 |
| JP | 05-267853 | 10/1993 |
| JP | 06-237081 | 8/1994 |
| JP | 6-237081 | 8/1994 |
| JP | 2000-119047 | 4/2000 |
| JP | 2000-299310 | 10/2000 |
| JP | 2001-053191 | 2/2001 |
| JP | 2003-142804 | 5/2003 |
| JP | 2005-005488 | 1/2005 |
| JP | 2006275954 | 10/2006 |
| JP | 2009-176791 | 8/2009 |
| JP | 2009-206502 | 9/2009 |
| JP | 2009-302506 | 12/2009 |
| KR | 10-2004-0058765 | 7/2004 |
| KR | 10-0701205 | 3/2007 |
| WO | 2011/084235 A2 | 7/2011 |
| WO | 2011084216 A2 | 7/2011 |
| WO | 2011084235 A2 | 7/2011 |
| WO | 2011084216 A3 | 9/2011 |
| WO | 2011084235 A3 | 9/2011 |
| WO | 2013133827 | 9/2013 |

OTHER PUBLICATIONS

International Preliminary Report on Patentability for PCT Application No. PCT/US10/54931, dated Jun. 28, 2012.
International Preliminary Report on Patentability for PCT Application No. PCT/US10/56310, dated Jun. 28, 2012.
International Preliminary Report on Patentability for PCT Patent Application No. PCT/US2012/028126, dated Sep. 18, 2014.
International Search Report and Written Opinion for PCT Application No. PCT/US10/54931, dated Jun. 30, 2011.
International Search Report and Written Opinion for PCT Application No. PCT/US10/56310, dated Jun. 30, 2011.
International Search Report and Written Opinion for PCT Patent Application No. PCT/US2012/028126, dated Nov. 30, 2012.
Notice of Allowance for Korean Patent Application No. 10-2012-7015462, dated Aug. 24, 2014.
Notice of Allowance for Korean Patent Application No. 10-2012-7015587, dated Apr. 9, 2014.
Notice of Allowance for Korean Patent Application No. 10-2014-7005894, dated Mar. 19, 2015.
Office Action for Chinese Patent Application No. 201080057189.8, dated Dec. 26, 2014.
Office Action for Chinese Patent Application No. 201080057189.8, dated May 4, 2014.
Office Action for Chinese Patent Application No. 201080058105.2, dated Dec. 12, 2014.
Office Action for Chinese Patent Application No. 201080058105.2, dated Jun. 3, 2014.
Office Action for German Patent Application No. 112010004888.6, dated Jul. 16, 2013.
Office Action for German Patent Application No. 112010004890.8, dated Jul. 23, 2013.
Office Action for Japanese Patent Application No. 2012-542016, dated Jun. 25, 2013.
Office Action for Korean Patent Application No. 10-2012-7015462, dated Aug. 19, 2013.
Office Action for Korean Patent Application No. 10-2012-7015462, dated Feb. 26, 2014.
Office Action for Korean Patent Application No. 10-2012-7015587, dated on Feb. 3, 2014.
Office Action for Korean Patent Application No. 10-2012-7015587, dated Jun. 25, 2013.
Office Action for Korean Patent Application No. 2012-7015462, dated Aug. 19, 2013.
Office Action for Korean Patent Application No. 2012-7015462, dated Feb. 26, 2014.
Office Action for Korean Patent Application No. 2012-7015587, dated Feb. 3, 2014.
Office Action for Korean Patent Application No. 2012-7015587, dated Jun. 25, 2013.
Office Action for Korean Patent Application No. 2014-7005894, dated Jun. 3, 2014.
Office Action for Korean Patent Application No. 2014-7005894, dated Oct. 21, 2014.
Office Action for Taiwan Patent Application No. 099136723, dated May 26, 2014.
Office Action for Taiwan Patent Application No. 099137777, dated Dec. 19, 2013.
Office Action for United Kingdom Patent Application No. 1208343.2, dated Dec. 19, 2013.
Office Action for United Kingdom Patent Application No. 1208343.2, dated Aug. 22, 2013.
NEC Schott "Schott Hermes" Components Corporation Japan, Copyright 2009, 2009.
NEC Schott, "Schott Hermes Substrate", Retrieved on Dec. 9, 2009, available at: http://www.nec-schott.co.jp/enplish/auto/others/heremes.html?PHPSESSID=r4nmcg11d95hgugh5r253hq3d3.
Onezawa, et al.,"NEC Schott introduces Glass Substrates with Hermetic Metal Through Vias for WLP of MEMS & Sensor Applications", Aug. 7, 2009.

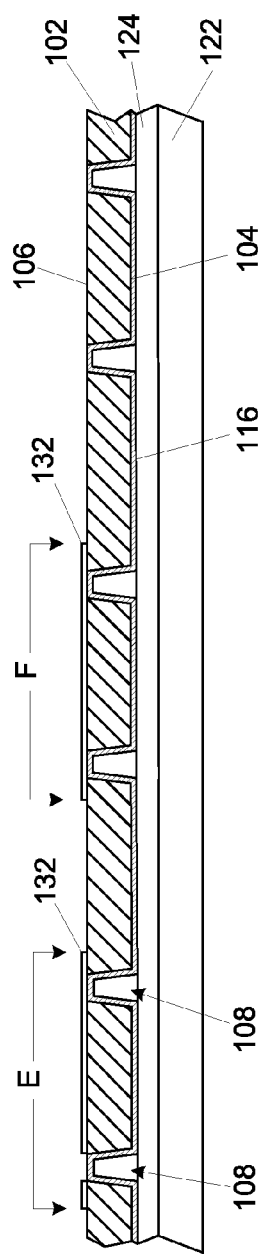
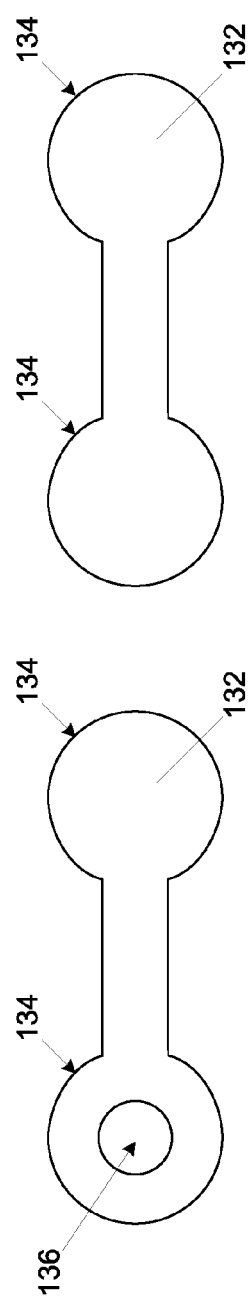
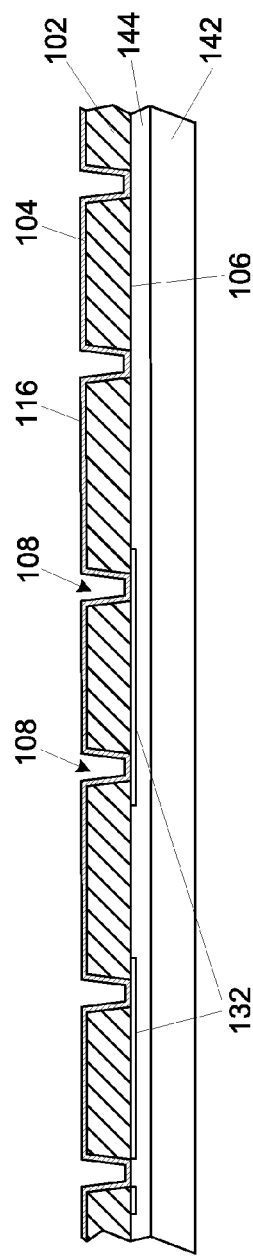
FIG. 1D
FIG. 1E
FIG. 1F
FIG. 1G

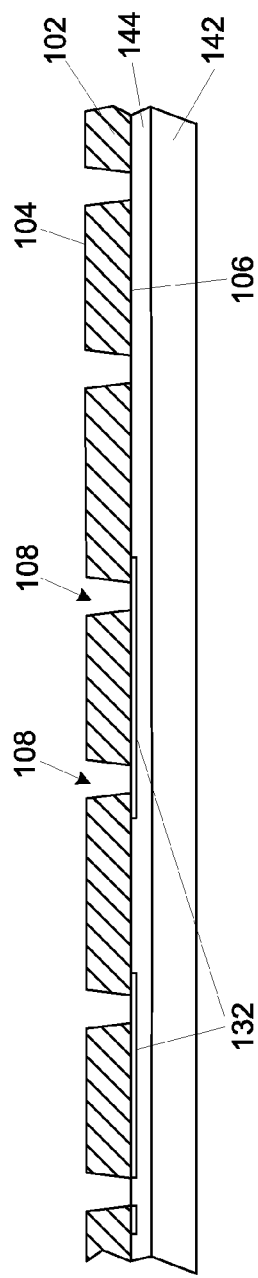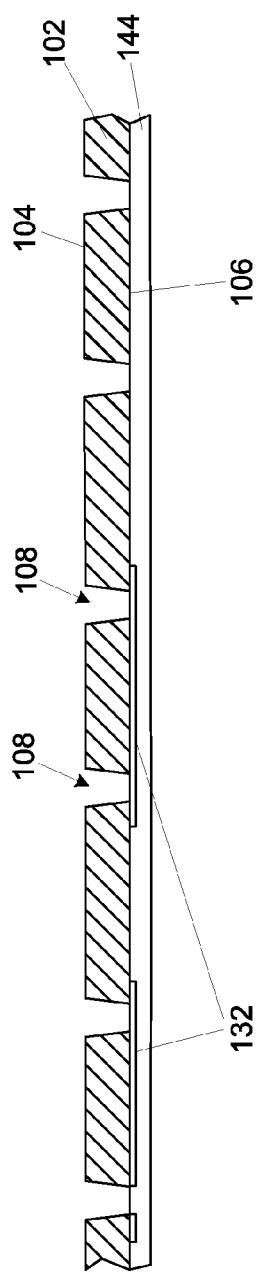

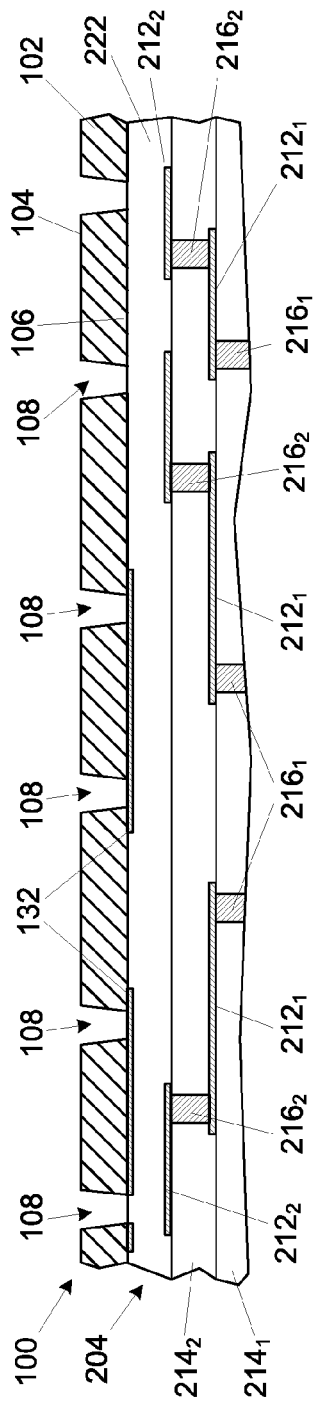
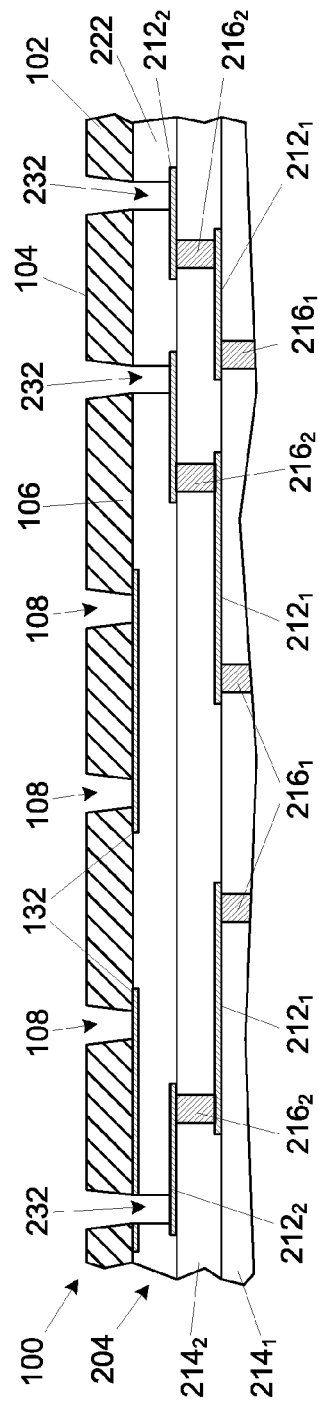
FIG. 2D
FIG. 2E

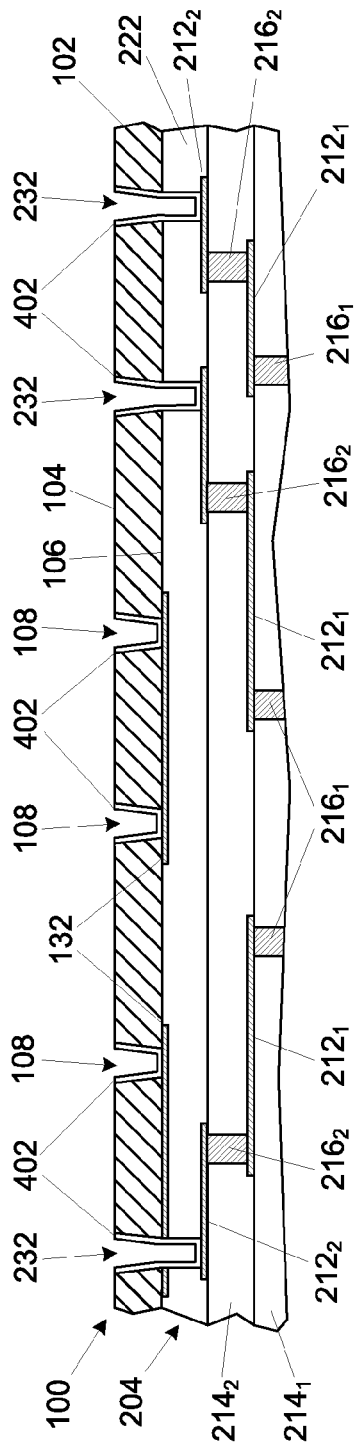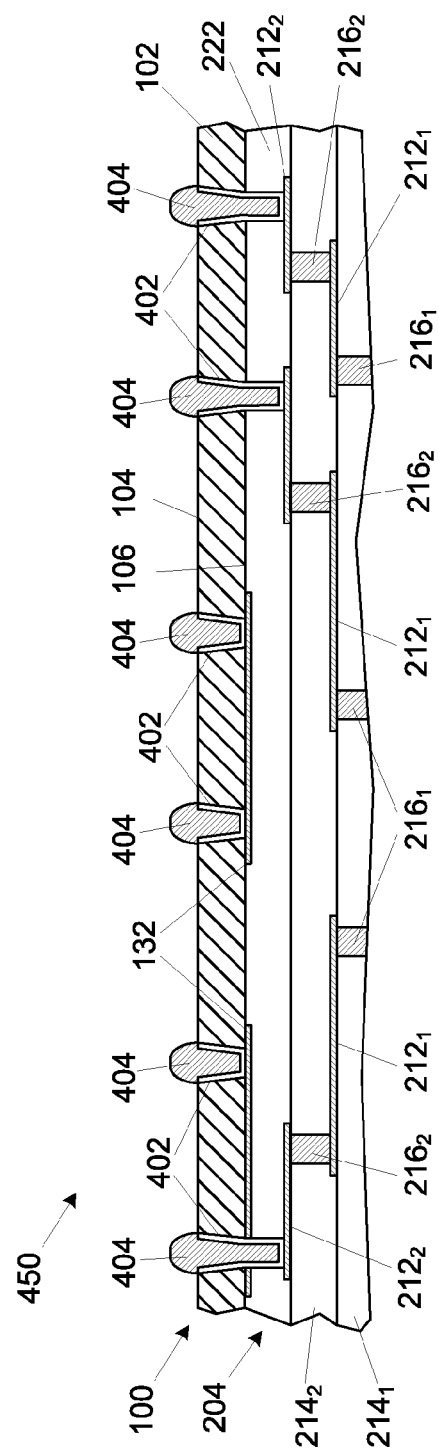
FIG. 4A
FIG. 4B

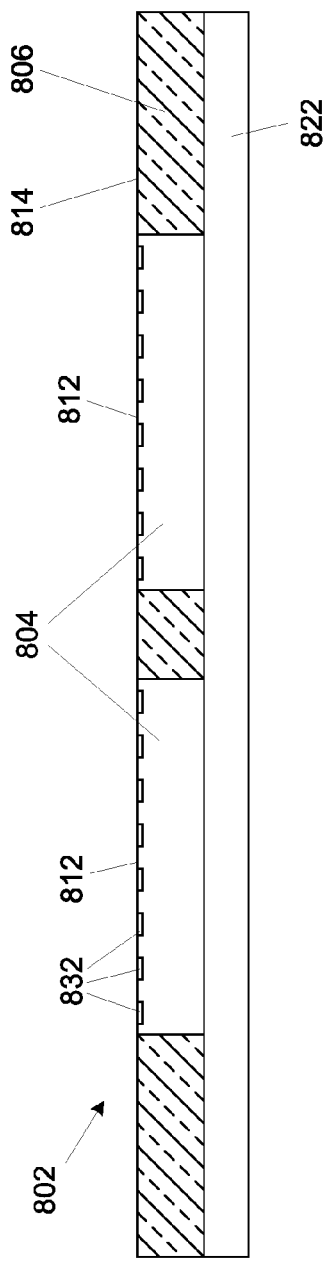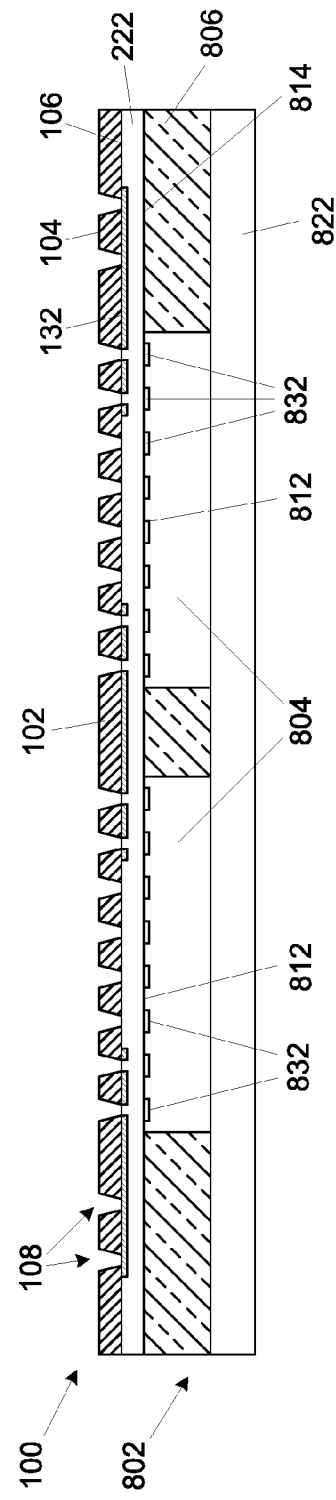
FIG. 8A
FIG. 8B

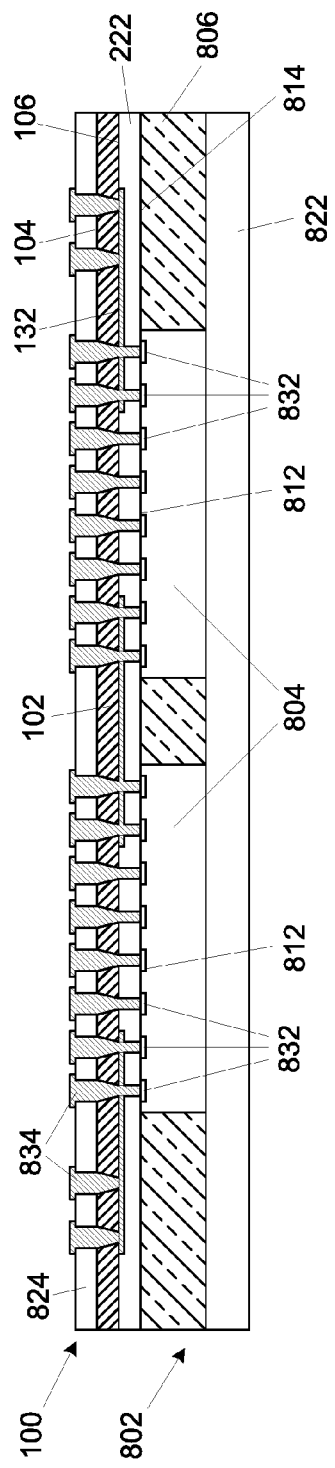
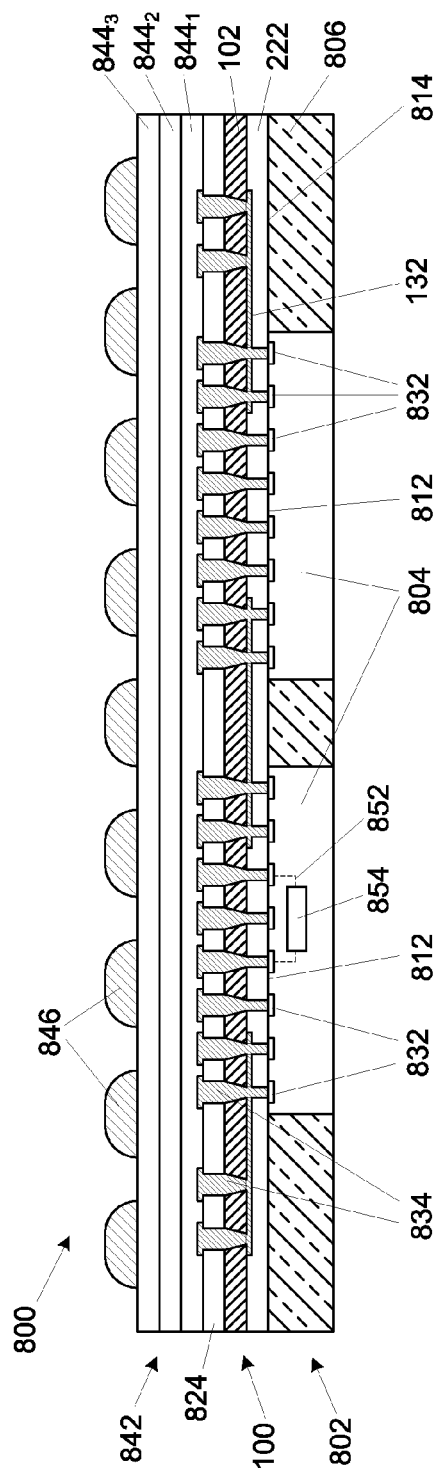
FIG. 8E
FIG. 8F

MICROELECTRONIC STRUCTURES HAVING LAMINATED OR EMBEDDED GLASS ROUTING STRUCTURES FOR HIGH DENSITY PACKAGING

RELATED APPLICATIONS

The present application is a divisional of U.S. patent application Ser. No. 14/618,235, filed on Feb. 10, 2015, entitled "MICROELECTRONIC STRUCTURES HAVING LAMINATED OR EMBEDDED GLASS ROUTING STRUCTURES FOR HIGH DENSITY PACKAGING", which is a divisional of U.S. patent application Ser. No. 13/625,406, filed Sep. 24, 2012, entitled "MICROELECTRONIC STRUCTURES HAVING LAMINATED OR EMBEDDED GLASS ROUTING STRUCTURES FOR HIGH DENSITY PACKAGING", now U.S. Pat. No. 9,001,520, issued Apr. 7, 2015, which are hereby incorporated herein in their entirety and all purposes.

BACKGROUND

Embodiments of the present description generally relate to the field of microelectronic structures, which may be used in the assembly of microelectronic packages, and processes for fabricating the same.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 1A-1K illustrate a side cross-sectional view of a process of forming a high density glass routing layer, according to one embodiment of the present description.

FIGS. 2A-2F illustrate a side cross-sectional view of a process of integrating the high density glass flex layer in a substrate, according to another embodiment of the present description.

FIGS. 4A-4B illustrate side cross-sectional views of alternate process steps with regard to the process illustrated in FIGS. 2A-2F, according to another embodiment of the present description.

FIGS. 8A-8F illustrate a side cross-sectional view of a process of integrating the high density glass flex layer in a microelectronic package, according to another embodiment of the present description.

DETAILED DESCRIPTION

Figure 1A:
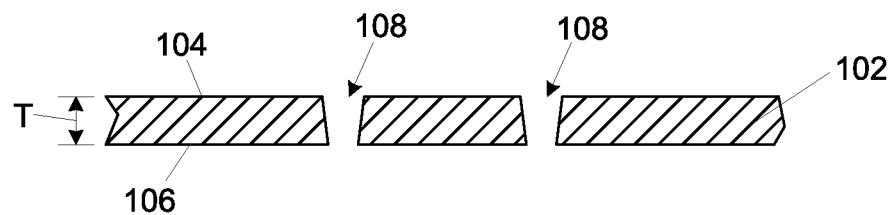

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic structures. The microelectronic structures may include a glass routing structure formed separately from a trace routing structure, wherein the glass routing structure is incorporated with the trace routing substrate, either in a laminated or embedded configuration. The glass routing structure can achieve high density trace routing, such that the density requirements may be relaxed on the trace routing substrate, which may result in reduced cost and allow for the fabrication of thin trace routing substrates. Also disclosed are embodiments of a microelectronic package including at least one microelectronic device disposed proximate to the glass routing structure of the microelectronic substrate and coupled with the microelectronic substrate by a plurality of interconnects. Further disclosed are embodiments of a microelectronic structure including at least one microelectronic device embedded within a microelectronic encapsulant having a glass routing structure attached to the microelectronic encapsulant and a trace routing structure formed on the glass routing structure.

As noted above, the disclosed embodiments encompass a microelectronic substrate including a glass routing structure. According to one embodiment of the present description, the term "glass" refers to an amorphous solid. Examples of glass materials that may be used with the described embodiments include substantially pure silica (e.g., approximately 100% SiO2), soda-lime glass, boro-silicate glass, and alumino-silicate glass. However, the disclosed embodiments are not limited to silica-based glass compositions, and glasses having alternative base materials (e.g., fluoride glasses, phosphate glasses, chalcogen glasses, ceramic materials (such as alumina), etc.) may also be employed with the disclosed embodiments. Further, any combination of other materials and additives may be combined with silica (or other base material) to form a glass having desired physical properties. Examples of these additives include not only the aforementioned calcium carbonate (e.g., lime) and sodium carbonate (e.g., soda), but also magnesium, calcium, manganese, aluminum, lead, boron, iron, chromium, potassium, sulfur, and antimony, as well as carbonates and/or oxides of these and other elements. The aforementioned glasses and additives are but a few examples of the many types of materials and material combinations that may find application with the disclosed embodiments. In addition, a glass layer or structure may include surface treatments and/or coatings to improve strength and/or durability. Furthermore, a glass layer or structure may also be annealed to lower internal stresses.

Generally, as used herein, the term "glass" does not refer to organic polymer materials, which may be amorphous in solid form. However, it should be understood that a glass according to some embodiments may include carbon as one of the material's constituents. For example, soda-lime glass, as well as numerous variations of this type of glass type, includes carbon. In addition, various ceramic materials may meet both physical and process requirements of the present description and are included within the term "glass" as used in the present description.

Figure 1B:
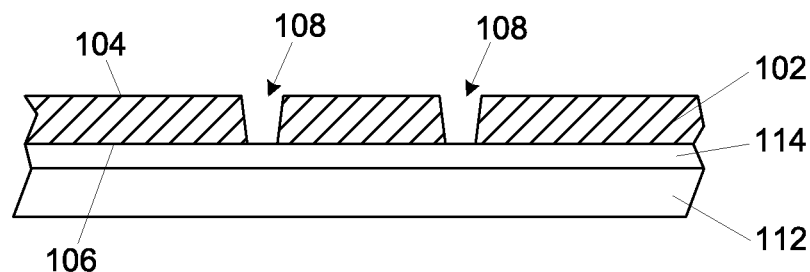

In one embodiment of the present disclosure, a glass routing structure may be formed in a manner shown in FIGS. 1A-1J. As shown in FIG. 1A, a thin glass layer 102 may be provided, wherein a plurality of through holes 108 are formed to extend through the glass layer 102 from a first surface 104 to a second surface 106 thereof. In an embodiment of the present description, the glass layer 102 may be between about 15 µm and about 100 µm in thickness T. In another embodiment of the present description, the glass layer through holes 108 may have a high density, which may be defined as having center-to-center pitches of less than about 45 µm. The glass layer through holes 108 may be formed by any known technique, including but not limited to imprinting, sand blasting, laser drilling, dry (e.g. plasma based) or wet etching, and the like. As shown in FIG. 1B, the glass layer second surface 106 may be attached to a first temporary carrier 112 with a first temporary adhesive layer 114. The first temporary carrier 112 may be any appropriate, substantially rigid, support structure and the first temporary adhesive layer 114 may be any appropriate adhesive material, as will be understood to those skilled in the art.

Figure 1C:
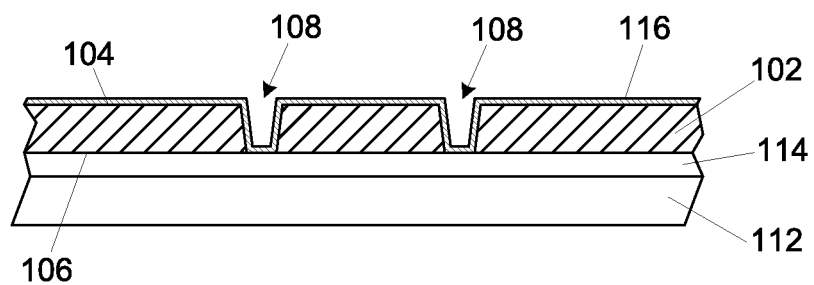

As shown in FIG. 1C, a filler layer 116 may be deposited over the glass layer first surface 104, into the glass layer through holes 108, and abutting portions of the first temporary adhesive layer 114 within the glass layer through holes 108. The filler layer 116 may be any appropriate material, including but not limited to a titanium/aluminum alloy. As shown in FIG. 1D, the glass layer 102 may be removed, flipped, and attached by the filler layer 116 to a second temporary carrier 122 with a second temporary adhesive layer 124. The second temporary carrier 122 may be any appropriate, substantially rigid, support structure, and may be the same as the first temporary carrier. The second temporary adhesive layer 124 may be any appropriate adhesive material, as will be understood to those skilled in the art, and may be the same material as the first temporary adhesive layer 114. As further shown in FIG. 1D, a plurality of conductive traces 132 (structures for routing electrical signals) may be formed on the glass layer second surface 106. The glass surface conductive traces 132 may be any appropriate conductive material, including but not limited to copper, aluminum, and alloys thereof. Additionally, the glass surface conductive traces 132 may be formed by any appropriate technique, including, but not limited to deposition, plating, and lamination, followed by patterning, such as lithography. The process as described in FIG. 1A-1D may result in high density conductive traces having 2/2 µm or finer line/space. As still further shown in FIG. 1d, at least one of the plurality of glass surface conductive traces 132 may span between at least two glass layer through holes 108.

As shown in FIGS. 1E and 1F (plan views along lines E and F, respectively, of FIG. 1D without the glass layer 102 shown), the glass surface conductive traces 132 may have any appropriate shape including expanded portions 134 proximate the glass layer through holes 108 (see FIG. 1D), and may have an opening 136 through the expanded portion 134, which will allow for the electrical connection of the glass surface conductive traces 132 to various microelectronic elements to be formed, as will be discussed.

Figure 1J:
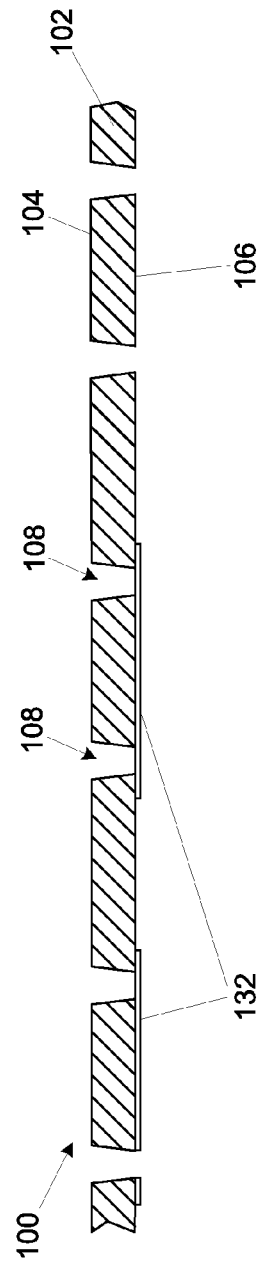

As shown in FIG. 1G, the glass layer 102 may be removed, flipped, and attached by the glass layer first surface 104 to a third temporary carrier 142 with a third temporary adhesive layer 144. The third temporary carrier 142 may be any appropriate, substantially rigid, support structure, and may be the first temporary carrier 112 or the second temporary carrier 122. The third temporary adhesive layer 144 may be any appropriate material having sufficient adhesive properties, as will be understood to those skilled in the art. As shown in FIG. 1H, the filler layer 116 may be removed by any technique known in the art, including but not limited to etching. As shown in FIG. 1I, the glass layer 102 may be removed from the third temporary carrier 142 and any residue of third temporary adhesive layer 144 removed, as shown in FIG. 1J, to form the glass routing structure 100.

Figure 1K:
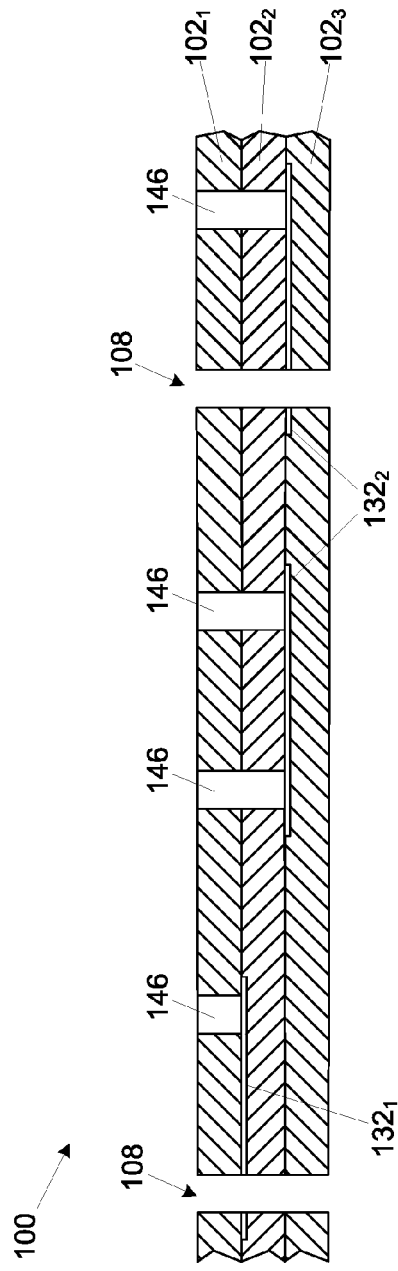

It is understood, as shown in FIG. 1K, that the glass routing structure 100 could have a plurality of glass layers (shown as elements $102_1$, $102_2$, and $102_3$), a plurality of glass surface conductive traces (shown as elements $132_1$ and $132_2$), and a plurality of conductive vias (shown as elements 146) extending through the glass layers (shown as elements $102_1$, $102_2$, and $102_3$). The process for the fabrication of the glass routing structure 100 shown in FIG. 1K will be apparent to those skilled in the art based on the present description.

Figure 2A:
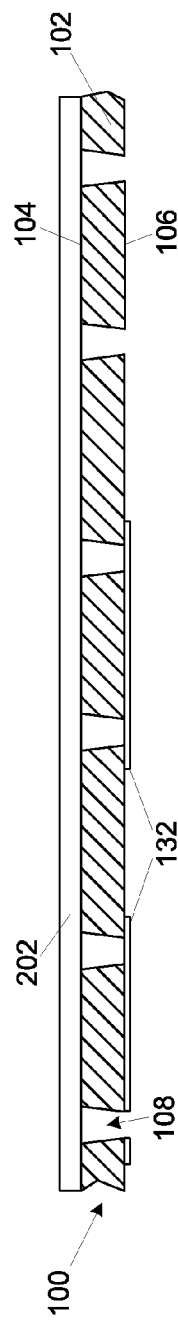
Figure 2B:
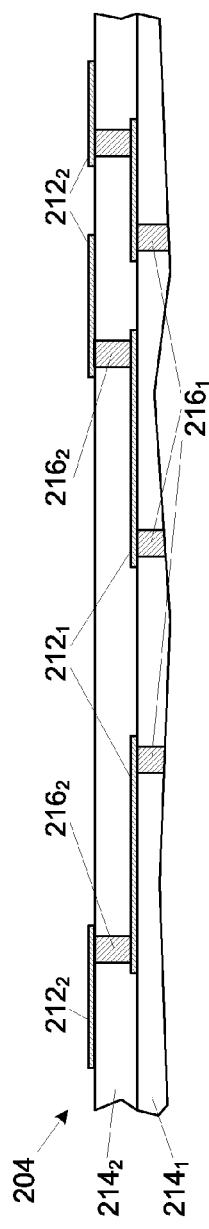

In one embodiment of the present disclosure, a microelectronic substrate may be formed in a manner shown in FIGS. 2A-2F. As shown in FIG. 2A, the glass layer first surface 104 may be attached to a tape film 202. As shown in FIG. 2B, a trace routing structure 204 may be provided. The trace routing structure 204 may in include a plurality of dielectric layers having conductive routes formed therein and therethrough. The trace route structure 204 may include at least one first level conductive trace $212_1$ formed on a first level dielectric layer $214_1$, wherein at least one first level conductive via $216_1$ may be formed to extend through the first level dielectric layer $214_1$ and be connected to further conductive structures (not shown). A second level dielectric layer $214_2$ may be formed on the first level dielectric layer $214_1$ and the first level conductive traces $212_1$. At least one second level conductive trace $212_2$ may be formed on the second level dielectric layer $214_2$, wherein at least one second level conductive trace $212_2$ may electrically contact at least one first level conductive trace $212_1$ through at least one second level conductive via $216_2$ extending through the second level dielectric layer $214_2$. It is understood that the process of forming conductive traces and dielectric layers is repeated until a desired number is achieved to form the trace routing structure 204. It is further understood that the final conductive trace (illustrated as element $212_2$) may be a landing pad, as known in the art.

The conductive traces (e.g. elements $212_1$ and $212_2$) may be composed of any conductive material, including but not limited to metals, such as copper and aluminum, and alloys thereof. In one embodiment, if the conductive traces (e.g. elements $212_1$ and $212_2$) are formed of copper or alloys thereof, a semi-additive, subtractive, or damascene process may be used, as will be understood to those skilled in the art. In another embodiment, if the conductive traces (e.g. elements $212_1$ and $212_2$) are formed of aluminum or alloys thereof, a subtractive process may be used, as will be understood to those skilled in the art. It is also understood that diffusion barriers to prevent ions of the conductive material from migrating may be required, particularly with the use of copper.

The dielectric layers (e.g. elements $214_1$ and $214_2$) may be compose of any appropriate dielectric, including but not limited to silicon dioxide ($SiO_2$), silicon oxynitride ($Si$-$O_xN_y$), and silicon nitride ($Si_3N_4$) and silicon carbide (SiC), as well as silica-filled epoxies and the like. In one embodiment, the dielectric layers are formed of silicon dioxide by a plasma enhance chemical vapor deposition process. In another embodiment, the dielectric layers are an organic dielectric that may be formed by printing or lamination.

The conductive vias (e.g. elements $216_1$ and $216_2$) may be formed in the dielectric layers (e.g. elements $216_1$ and $216_2$) may be formed by forming an opening therethrough by dry or wet etching, laser ablation, ion drilling, a combination of these, or the like, and filling the opening with a conductive material, such in manner described with regard to the formation of the conductive traces (e.g. elements $212_1$ and $212_2$).

Figure 2C:
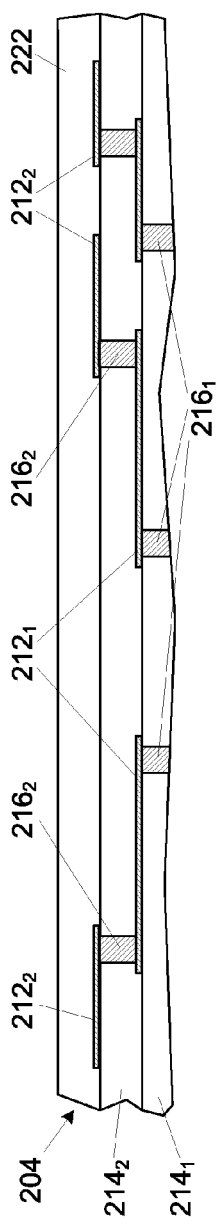

As shown in FIG. 2C, a dielectric adhesive material layer 222 may be formed over the trace routing structure 204. In one embodiment, the dielectric adhesive material layer 222 may be an organic adhesive material and may be laminated or printed over the trace routing structure 204. In another embodiment, the dielectric adhesive material layer 222 may be partially cured to retain adhesive properties, while still being soft enough to conform to a shape a subsequently attached glass routing structure.

As shown in FIG. 2D, the glass routing structure 100 of FIG. 1J may be aligned on the dielectric adhesive material layer 222 of FIG. 2C. Pressure may be applied for lamination as the dielectric adhesive material layer 222 is cured and the tape film 202 (see FIG. 2A) may then be removed. As shown in FIG. 2E, the glass layer 102 may be used a hard mask to etch openings 232 through the dielectric adhesive material layer 222 to expose a portion of at least one first level conductive trace $212_1$. In one embodiment, the openings 232 may be formed with an oxygen plasma etching process.

Figure 2F:
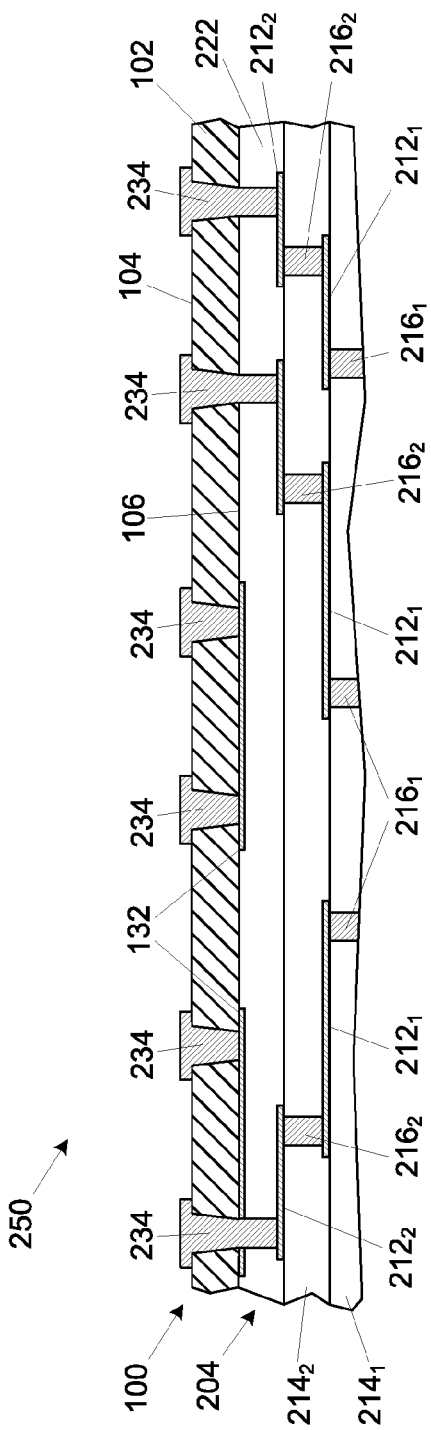

As shown in FIG. 2F, the openings 232 of FIG. 2e may be filled with a conductive material to form through-glass contacts, such as conductive bumps 234 thereby forming a microelectronic substrate 250. In one embodiment, a semi-additive plating process may be used to form the conductive bumps 234. The conductive bumps 234 may be any appropriate conductive material, including but not limited to copper, aluminum, and alloys thereof.

Figure 3:
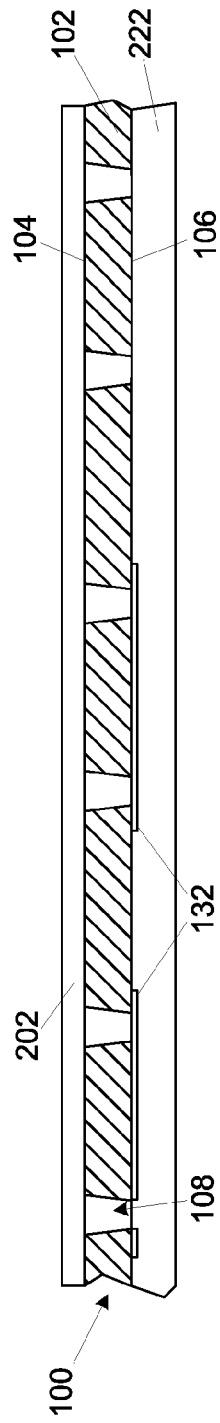
FIG. 3 illustrates a side cross-sectional view of an alternate process step with regard to the process illustrated in FIGS. 2A-2F, according to an embodiment of the present description.

In another embodiment beginning with FIG. 2A, the dielectric adhesive material layer 222 may be applied to the glass layer second surface 106, as shown in FIG. 3. The dielectric adhesive material layer 222 may then be attached to the trace routing structure 204 to form the structure shown in FIG. 2D.

In another embodiment, the through-glass contacts (shown as conductive bumps 234 in FIG. 2F) may be formed of a solder material. Beginning at the structure shown in FIG. 2E, underbump metallization layers 402 may be formed to substantially cover the surfaces within each of the glass layer through holes 108 and the openings 232, as shown in FIG. 4A. The purposes and processes (such as deposition, plating, etching, planarization, and the like) for forming the underbump metallization layers 402 are well known in the art. As show in FIG. 4B, a solder material may be deposited within each of the glass layer through holes 108 (see FIG. 4A) and the openings 232 (see FIG. 4B), wherein the glass layer 102 may act as a solder mask, to form solder contacts 404 as the through-glass contacts, thereby forming a microelectronic substrate 450. The solder material may be applied by any technique known in the art, including but not limited to vacuum solder paste printing. The solder contacts 404 may be made of any appropriate material, including, but not limited to, lead/tin alloys and high tin content alloys (e.g. 90% or more tin), and similar alloys.

Figure 5:
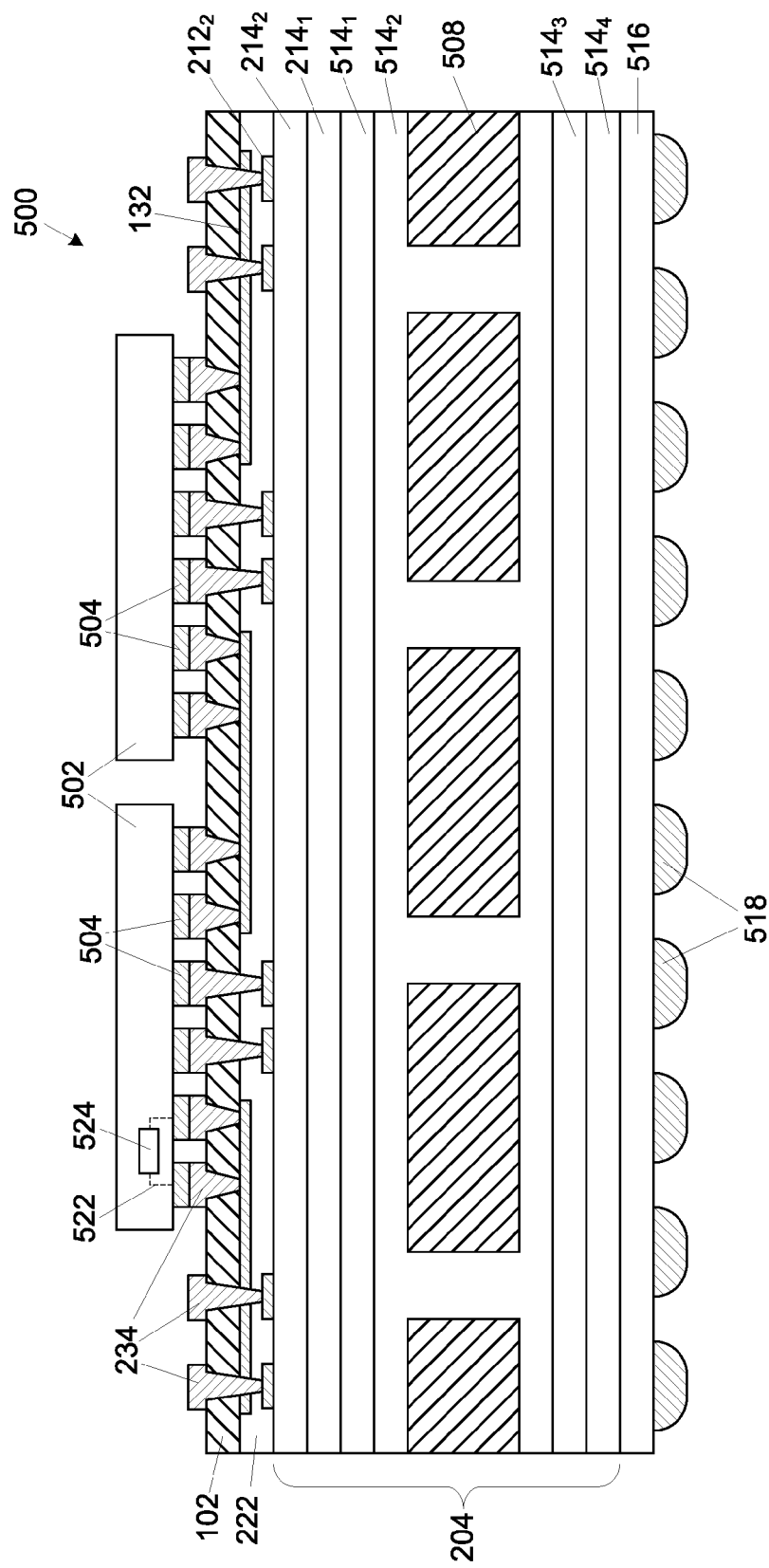
FIG. 5 illustrates side cross-sectional views of microelectronic package, according to an embodiment of the present description.

It is understood that the embodiments described with regard to FIGS. 1A-1K, 2A-2F, 3, 4A, and 4B may be a portion of a microelectronic package 500 illustrated in FIG. 5. For example, at least one microelectronic device 502, such as a microprocessor, a chipset, a graphics device, a wireless device, a memory device, an application specific integrated circuit, or the like, may be electrically attached through bond pads 504 thereon to mirror image through-glass contacts, such as conductive bumps 234. The trace routing structure 204 may include the first level dielectric layer $214_1$ and the second level dielectric layer $214_2$, as shown in FIGS. 2B-2F and 4A-4B, and may include additional dielectric layers $514_1$-$514_4$. The trace routing structure 204 may further include a core structure 508 within the additional dielectric layers $514_1$-$514_4$, a solder resist layer 516, and external interconnects 518. As such trace routing structures 204 are well known in the art and for the sake of clarity and brevity, the conductive traces and conductive vias (such as conductive traces $212_1$/$212_2$ and conductive vias $216_1$/$216_2$ of FIGS. 2B-2F and 4A-4B), which may form electrical routes between the microelectronic devices 502, the conductive bumps 234, and/or the external interconnects 518, are not illustrated. As illustrated in FIG. 5, the glass surface conductive traces 132 may provide high bandwidth communication between adjacent microelectronic devices 502 and/or may be used as high density escape routes. In one embodiment of the microelectronic package 500, the microelectronic device 502 may include a plurality of conductive traces 522 forming electronic connections between the microelectronic device bond pads 504 and integrated circuitry 524 within the microelectronic device 502, wherein the microelectronic device conductive traces 522 have an average pitch (e.g. average width between conductive traces). The trace routing structure 204 comprising a plurality of dielectric layers and conductive traces, wherein the trace routing structure conductive traces (see elements $212_1$ and $212_2$ of FIGS. 2B-2F) may also have an average pitch and the the glass routing structure conductive traces 132 may have an average pitch. In an embodiment of the present description, the average pitch of the glass routing structure conductive traces 132 is greater than the average pitch of the microelectronic device conductive traces 522 and less than the average pitch of the trace routing structure conductive traces (see elements 212$_1$ and 212$_2$ of FIGS. 2B-2F).

Figure 6:
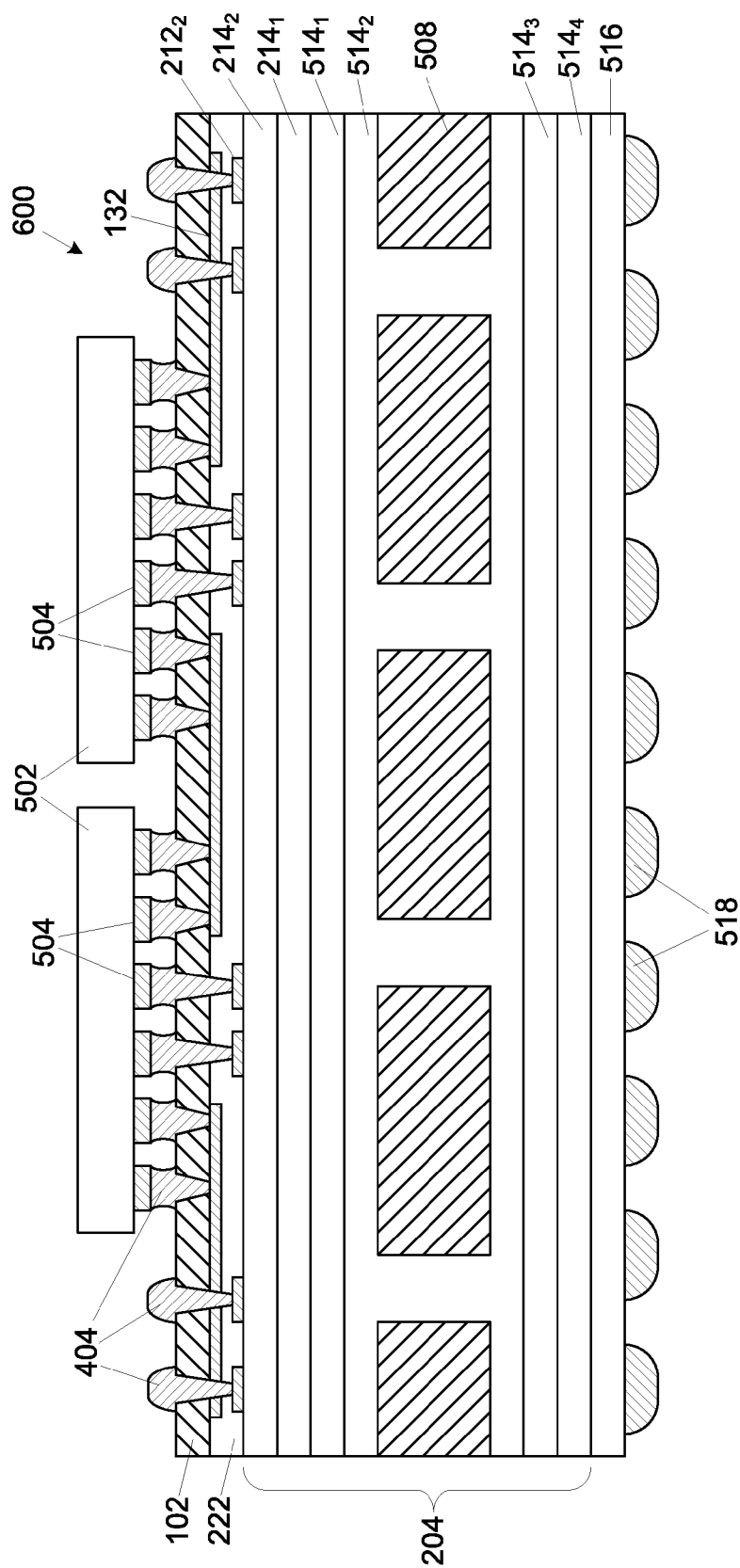
FIG. 6 illustrates side cross-sectional views of microelectronic package, according to another embodiment of the present description.

FIG. 6 illustrates a microelectronic package 600 which is similar to that of the microelectronic package 500 of FIG. 5 with the exception that microelectronic devices 502 are attached with the solder contacts 404 of FIGS. 4A-4B.

Figure 7:
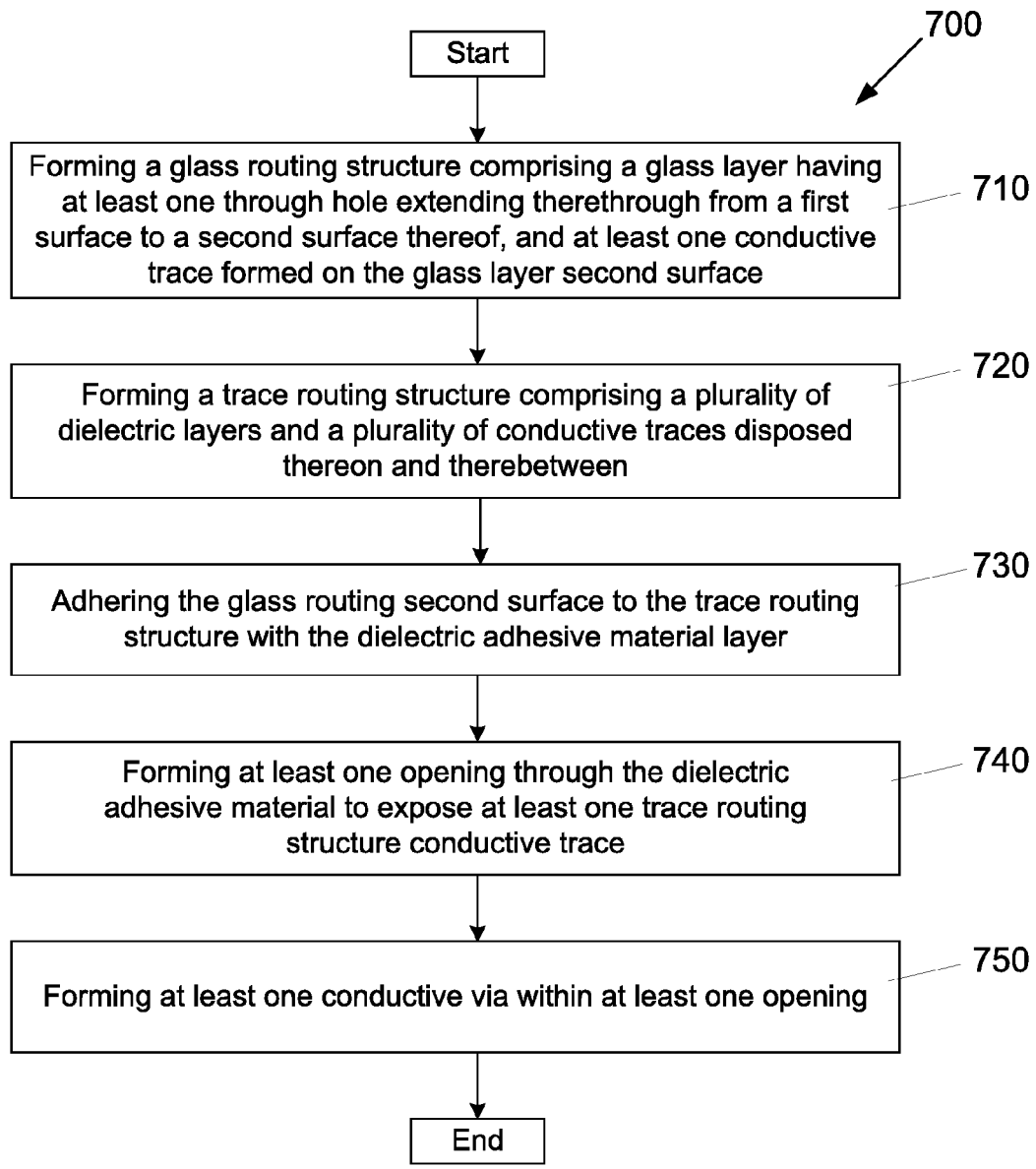
FIG. 7 is a flow diagram of a process of fabricating a microelectronic structure, according to an embodiment of the present description.

An embodiment of another process of fabricating a microelectronic structure of the present description is illustrated in a flow diagram 700 of FIG. 7. As defined in block 710, a glass routing structure may be formed comprising a glass layer having at least one through hole extending from a first surface of the glass layer to a second surface of the glass layer, and at least one conductive trace formed on the glass layer second surface. As defined in block 720, a trace routing structure may be formed comprising a plurality of dielectric layers and conductive traces. The glass routing structure second surface may be adhered to the trace routing structure with the dielectric adhesive material layer, as defined in block 730. At least one opening may be formed through the dielectric adhesive material layer to expose at least one trace routing structure conductive trace, as defined in block 740. As defined in block 750, at least one conductive via may be formed within the at least one opening.

In another embodiment of the present description, a glass layer may be embedded in a microelectronic package. As shown in FIG. 8A, an encapsulated structure 802 may be provided having at least one microelectronic device 804 embedded within an encapsulation material 806, such that an active surface 812 of the microelectronic device 804 may be substantially planar with a first surface 814 of the encapsulation material 806, such that the microelectronic device active surface 812 does not have encapsulation material 806 thereon. As further shown in FIG. 8A, the encapsulated structure 802 may be placed on a temporary carrier 822.

As shown in FIG. 8B, the glass routing structure 100 may be adhered to the at least one microelectronic device active surface 812 and the encapsulation material first surface 814 with the dielectric adhesive material layer 222. The dielectric adhesive material layer 222 may be first applied to the glass routing structure 100 or may be first applied to the at least one microelectronic device active surface 812 and the encapsulation material first surface 814.

Figure 8C:
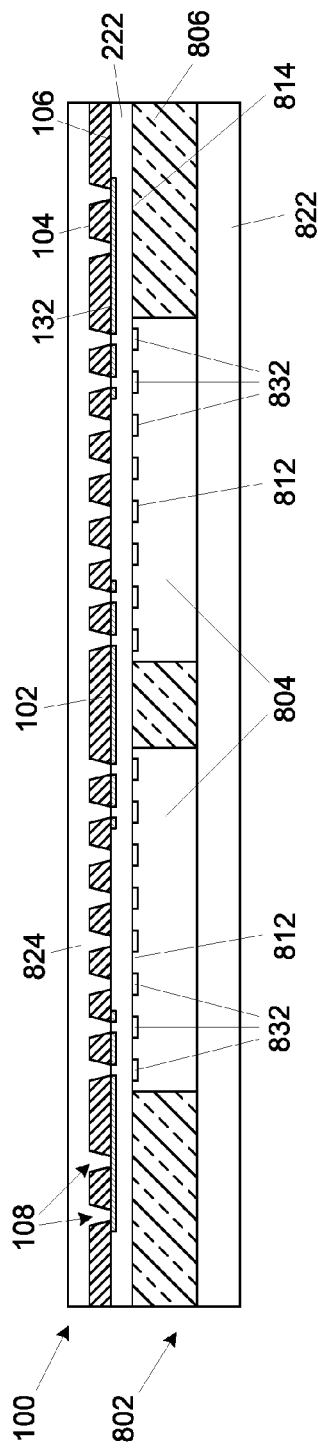
Figure 8D:
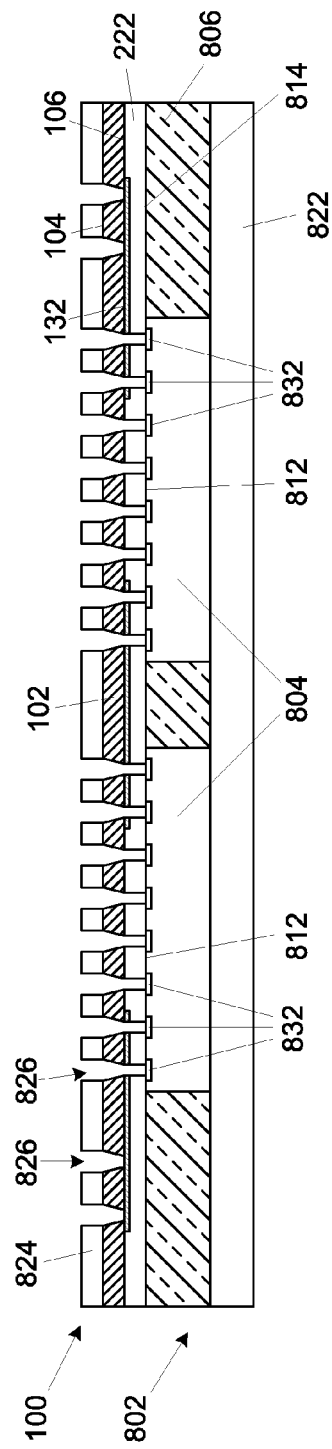

As shown in FIG. 8C, a first dielectric layer 824 may be disposed over the glass routing structure 100 and into the glass layer through holes 108. As shown in FIG. 8D, at least one via 826 may be formed through the first dielectric layer 824 and the glass layer through holes 108 to expose at least one glass surface conductive trace 132, or may be formed through the first dielectric layer 824, through the glass layer through holes 108, and through the dielectric adhesive material layer 222 to expose at least one bond pad 832 of the microelectronic device 802. The vias 826 may be formed by any technique known in the art, including, but not limited to, laser drilling.

As shown in FIG. 8E, at least one conductive via 834 may be formed by filling at least one via 826 with a conductive material. The vias 826 may be filled by any technique known in the art, including, but not limited to, additive plating. The conductive vias 834 may be composed of any conductive material, including but not limited to metals, such as copper and aluminum, and alloys thereof. As shown in FIG. 8F, a trace routing structure 842 may be formed on the first dielectric layer 824 and the conductive vias 834 in a manner as previously discussed with regard to the formation of the trace routing structure 204 of FIGS. 2B-2F, 4A-4B, 5, and 6, wherein at least one dielectric layer (shown as elements 844$_1$, 844$_2$, and 844$_3$) may be formed with conductive traces and vias formed thereon and therethrough (not shown for clarity and brevity) and may terminate in at least one external interconnect 846, as will be understood to those skilled in the art. As further shown in FIG. 8F, the temporary carrier 822 (see FIG. 8E) may be removed to form the microelectronic package 800. In one embodiment of the microelectronic package 800, the microelectronic device 804 may include a plurality of conductive traces 852 forming electronic connections between the microelectronic device bond pads 832 and integrated circuitry 854 within the microelectronic device 502, wherein the microelectronic device conductive traces 852 have an average pitch (e.g. average width between conductive traces). The trace routing structure 842 comprising a plurality of dielectric layers and conductive traces, wherein the trace routing structure conductive traces (see elements 212$_1$ and 212$_2$ of FIGS. 2B-2F) may also have an average pitch and the the glass routing structure conductive traces 132 may have an average pitch. In an embodiment of the present description, the average pitch of the glass routing structure conductive traces 132 is greater than the average pitch of the microelectronic device conductive traces 852 and less than the average pitch of the trace routing structure conductive traces (see elements 212$_1$ and 212$_2$ of FIGS. 2B-2F).

Figure 9:
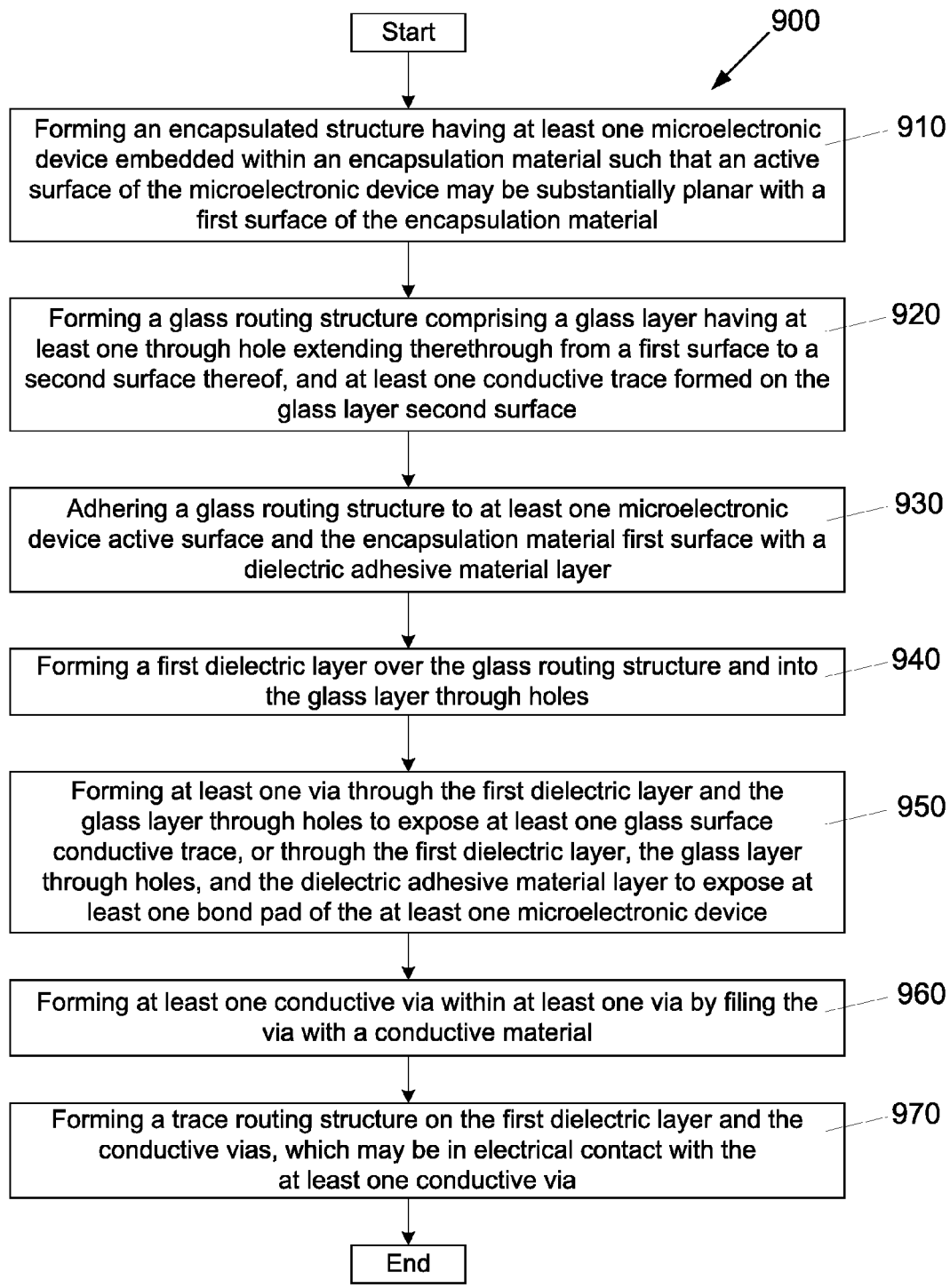
FIG. 9 is a flow diagram of a process of fabricating a microelectronic structure, according to an embodiment of the present description.

An embodiment of another process of fabricating a microelectronic structure of the present description is illustrated in a flow diagram 900 of FIG. 9. As defined in block 910, an encapsulated structure may be formed having at least one microelectronic device embedded within an encapsulation material such that an active surface of the microelectronic device may be substantially planar with a first surface of the encapsulation material. A glass routing structure may be formed comprising a glass layer having at least one through hole extending from a first surface of the glass layer to a second surface of the glass layer, and at least one conductive trace formed on the glass layer second surface, as defined in block 920. As defined in block 930, the glass routing structure may be adhered to the at least one microelectronic device active surface and the encapsulation material first surface with the dielectric adhesive material layer. A first dielectric layer may be formed over the glass routing structure and into the glass layer through holes, as defined in block 940. At least one via may be formed through the first dielectric layer and the glass layer through holes to expose at least one glass surface conductive trace, or may be formed through the first dielectric layer, through the glass layer through holes, and through the dielectric adhesive material layer to expose at least one bond pad of the at least one microelectronic device, as defined in block 950. As defined in block 960, at least one conductive via may be formed by filling at least one via with a conductive material. A trace routing structure may be formed on the first dielectric layer and the conductive vias, which may be in electrical communication with at least one conductive via, as defined in block 970.

Figure 10:
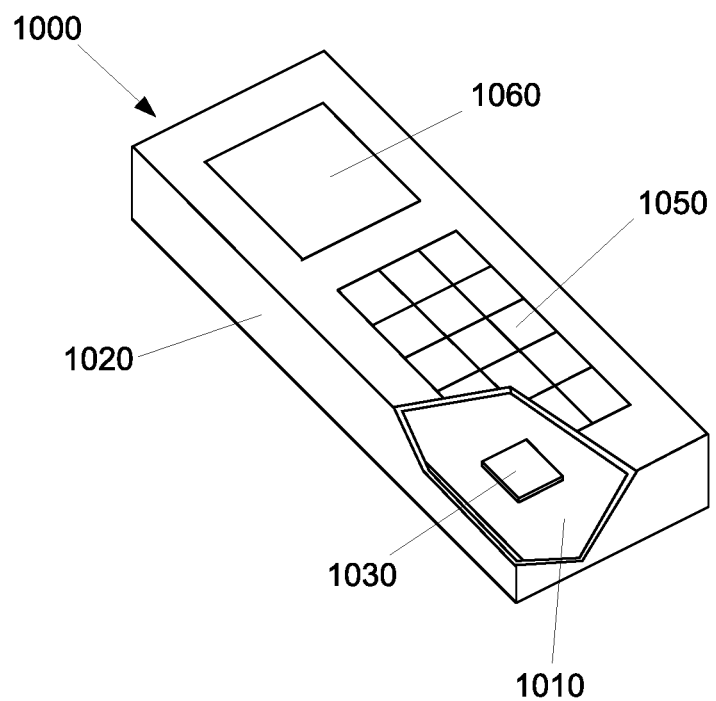
FIG. 10 illustrates an electronic system/device, according to one implementation of the present description.

FIG. 10 illustrates an embodiment of a electronic system/device 1000, such as a portable computer, a desktop computer, a mobile telephone, a digital camera, a digital music player, a web tablet/pad device, a personal digital assistant, a pager, an instant messaging device, or other devices. The electronic system/device 1000 may be adapted to transmit and/or receive information wirelessly, such as through a wireless local area network (WLAN) system, a wireless personal area network (WPAN) system, and/or a cellular network. The electronic system/device 1000 may include a microelectronic motherboard 1010 disposed within a device housing 1020. A microelectronic package 1030 may be attached to the microelectronic motherboard 1010. As with the embodiments of the present application, the microelectronic package 1030 may include a microelectronic substrate (not shown) comprising a trace routing structure (not shown) having a glass routing structure incorporated on (e.g. laminated) or in (e.g. embedded) the trace routing substrate. The microelectronic motherboard 1010 may be attached to various peripheral devices including an input device 1050, such as keypad, and a display device 1060, such an LCD display. It is understood that the display device 1060 may also function as the input device, if the display device 1060 is touch sensitive.

It is understood that the subject matter of the present description is not necessarily limited to specific applications illustrated in the figures. The subject matter may be applied to other microelectronic structure fabrication applications, as well as to other applications outside of the field of microelectronic structure fabrication, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic structure, comprising:
a glass routing structure comprising a glass layer having a plurality of through holes extending from a first surface of the glass layer to a second surface of the glass layer, and at least one conductive trace abutting the second surface of the glass layer;
a trace routing structure comprising a plurality of dielectric layers and at least one conductive trace, wherein the second surface of the glass layer is adhered to the trace routing structure with a dielectric adhesive material layer; and
a plurality of conductive vias extending through the plurality of through holes of the glass layer, wherein at least one conductive via of the plurality of conductive vias extends through the glass routing structure and the dielectric adhesive material, and contacts the at least one conductive trace of the trace routing structure.

2. The microelectronic structure of claim 1, further comprising at least one other conductive via of the plurality of conductive vias contacting the at least one conductive trace abutting the second surface of the glass layer.

3. The microelectronic structure of claim 1, wherein the glass routing structure comprises at least one conductive trace abutting the glass routing structure and spanning between at least two through holes of the plurality of through holes of the glass routing structure.

4. The microelectronic structure of claim 1, further including at least one microelectronic device electrically attached to at least one conductive via of the plurality of conductive vias.

5. The microelectronic structure of claim 1, wherein the at least one conductive via of the plurality of conductive vias comprises a solder contact.

6. A microelectronic structure, comprising:
a glass routing structure comprising a glass layer having a plurality of through holes extending from a first surface of the glass layer to a second surface of the glass layer, and at least one conductive trace abutting the second surface of the glass layer;
at least one microelectronic device having a plurality of bond pads, wherein the second surface of the glass layer is adhered to the at least one microelectronic device with a dielectric adhesive material layer; and
a plurality of conductive vias extending through the plurality of through holes of the glass layer, wherein at least one conductive via of the plurality of conductive vias extends through the glass routing structure and the dielectric adhesive material, and contacts at least one bond pad of the plurality of bond pads of the at least one microelectronic device.

7. The microelectronic structure of claim 6, further comprising a trace routing structure comprising a plurality of dielectric layers and at least one conductive trace, wherein the trace routing structure abuts the first surface of the glass layer.

8. The microelectronic structure of claim 7, wherein at least one conductive via of the plurality of conductive vias extends through at least one dielectric layer of the plurality of dielectric layers of the trace routing structure, the glass routing structure, and the dielectric adhesive material, and contacts the at least one bond pad of the plurality of bond pads of the at least one microelectronic device.

9. The microelectronic structure of claim 6, further comprising at least one other conductive via of the plurality of conductive vias contacting the at least one conductive trace abutting the second surface of the glass layer.

10. The microelectronic structure of claim 6, wherein the glass routing structure comprises at least one conductive trace spanning between at least two through holes of the plurality of through holes of the glass routing structure.

11. A method of forming a microelectronic structure, comprising: forming a glass routing structure comprising a glass layer having a plurality of through holes extending from a first surface of the glass layer to a second surface of the glass layer, and at least one conductive trace abutting the second surface of the glass layer; forming a trace routing structure comprising a plurality of dielectric layers and at least one conductive trace; adhering the trace routing structure to the second surface of the glass layer with a dielectric adhesive material layer; and forming a plurality of conductive vias extending through the plurality of through holes of the glass layer, wherein at least one conductive via of the plurality of conductive vias extends through the glass routing structure and the dielectric adhesive material, and contacts the at least one conductive trace of the trace routing structure.

12. The method of claim 11, further comprising forming at least one other conductive via of the plurality of conductive vias to contact the at least one conductive trace abutting the second surface of the glass layer.

13. The method of claim 11, wherein forming the glass routing structure further comprises forming at least one conductive trace abutting the glass routing structure and spanning between at least two through holes of the plurality of through holes of the glass routing structure.

14. The method of claim 11, further including electrically attaching at least one microelectronic device to at least one conductive via of the plurality of conductive vias.

15. The method of claim 11, wherein the forming the at least one conductive via comprises forming a solder contact.

16. A method of forming a microelectronic structure, comprising: forming a glass routing structure comprising a glass layer having a plurality of through holes extending from a first surface of the glass layer to a second surface of the glass layer, and at least one conductive trace abutting the second surface of the glass layer; forming at least one microelectronic device having a plurality of bond pads, wherein the second surface of the glass layer is adhered to the at least one microelectronic device with a dielectric adhesive material layer; and forming a plurality of conductive vias extending through the plurality of through holes of the glass layer, wherein at least one conductive via of the plurality of conductive vias extends through the glass routing structure and the dielectric adhesive material, and contacts at least one bond pad of the plurality of bond pads of the at least one microelectronic device.

17. The method of claim 16, further comprising forming a trace routing structure comprising a plurality of dielectric layers and at least one conductive trace, wherein the trace routing structure abuts the first surface of the glass layer.

18. The method of claim 17, wherein at least one conductive via of the plurality of conductive vias extends through at least one dielectric layer of the plurality of dielectric layer of the trace routing structure, the glass routing structure, and the dielectric adhesive material, and contacts the at least one bond pad of the plurality of bond pads of the at least one microelectronic device.

19. The method of claim 16, further comprising at least one other conductive via of the plurality of conductive vias contacting the at least one conductive trace abutting the second surface of the glass layer.

20. The method of claim 16, wherein the glass routing structure comprises at least one conductive trace spanning between at least two through holes of the plurality of through holes of the glass routing structure.

* * * * *